United States Patent
Jiang et al.

(10) Patent No.: US 10,312,466 B2
(45) Date of Patent: Jun. 4, 2019

(54) DISPLAY PANEL, METHOD FOR PREPARING THE SAME AND WEARABLE DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Liangliang Jiang, Beijing (CN); Lei Guo, Beijing (CN); Yongjun Yoon, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 54 days.

(21) Appl. No.: 15/571,464

(22) PCT Filed: Jun. 8, 2017

(86) PCT No.: PCT/CN2017/087516
§ 371 (c)(1),
(2) Date: Nov. 2, 2017

(87) PCT Pub. No.: WO2018/032863
PCT Pub. Date: Feb. 22, 2018

(65) Prior Publication Data
US 2019/0131566 A1    May 2, 2019

(30) Foreign Application Priority Data
Aug. 15, 2016 (CN) .................... 2016 2 0883966 U

(51) Int. Cl.
*H01L 51/52* (2006.01)
*H01L 51/56* (2006.01)
(Continued)

(52) U.S. Cl.
CPC .......... *H01L 51/52* (2013.01); *H01L 51/0097* (2013.01); *H01L 51/5253* (2013.01);
(Continued)

(58) Field of Classification Search
CPC ........ H01L 27/3241–27/3297; H01L 51/0097; H01L 51/50–51/56; H01L 2251/5338
See application file for complete search history.

(56) References Cited

U.S. PATENT DOCUMENTS

2016/0181347 A1* 6/2016 Lou .................. H01L 51/52
257/40
2017/0108971 A1 4/2017 Yang et al.

FOREIGN PATENT DOCUMENTS

CN       104505373 A    4/2015
CN       104576709 A    4/2015
(Continued)

OTHER PUBLICATIONS

International Search Report received for PCT Patent Application No. PCT/CN2017/087516, dated Aug. 25, 2017, 6 pages (2 pages of English Translation and 4 pages of Original Document).

*Primary Examiner* — Daniel P Shook
(74) *Attorney, Agent, or Firm* — Womble Bond Dickinson (US) LLP

(57) ABSTRACT

The disclosure provides a display panel, a method for preparing the same and a wearable device. The display panel comprises a display panel body, wherein the display panel body has at least one through-hole, and the through-hole is filled with a hydrophobic gas-permeable material.

20 Claims, 5 Drawing Sheets

(51) Int. Cl.
*H01L 27/32* (2006.01)
*H01L 51/00* (2006.01)

(52) U.S. Cl.
CPC .......... *H01L 51/56* (2013.01); *H01L 27/3276* (2013.01); *H01L 2251/5338* (2013.01)

(56) References Cited

FOREIGN PATENT DOCUMENTS

| | | |
|---|---|---|
| CN | 204287664 U | 4/2015 |
| CN | 105278748 A | 1/2016 |
| CN | 205984154 U | 2/2017 |
| KR | 10-2016-0028550 A | 3/2016 |

* cited by examiner

DISPLAY PANEL, METHOD FOR PREPARING THE SAME AND WEARABLE DEVICE

RELATED APPLICATION

The present application is the U.S. national phase entry of PCT/CN2017/087516, with an international filing date of Jun. 8, 2017, which claims the benefit of Chinese Patent Application No. 201620883966.9 filed on Aug. 15, 2016, the entire disclosures of which are incorporated herein by reference.

TECHNICAL FIELD

The disclosure relates to the field of display technology, and in particular, to a display panel, a method for preparing the same and a wearable device.

BACKGROUND

Wearable devices such as smart watches, smart bracelets, etc. are one of the important development directions of intelligent terminal devices in the future. Since a wearable device needs to be worn on the part such as an arm etc. of a human body, the wearable device needs to fit the contour of the wearing part of the human body, which requires that the display assembly in the wearable device be prepared to fit the shape of the wearing part of the human body.

An existing display apparatus does not have gas permeability, and when it is used as the display assembly of a wearable device, this will result in that the area in the wearable device where the display assembly is arranged is impermeable to gas, thereby leading to poor wearing comfortability of the wearable device.

SUMMARY

A display panel provided by an embodiment of the disclosure comprises a display panel body, wherein the display panel body has at least one through-hole, and the through-hole is filled with a hydrophobic gas-permeable material.

Alternatively or additionally, in the display panel provided by an embodiment of the disclosure, the display panel body has a display area and a peripheral area surrounding the display area, and the through-hole is located in the display area.

Alternatively or additionally, in the display panel provided by an embodiment of the disclosure, the display area of the display panel body has a substrate and a pixel unit located on the substrate, the through-hole is located within an area where the pixel unit is located, and the through-hole runs through the substrate and the pixel unit.

Alternatively or additionally, in the display panel provided by an embodiment of the disclosure, the hydrophobic gas-permeable material is a polymer with multiple micropores.

Alternatively or additionally, in the display panel provided by an embodiment of the disclosure, the pore size of the micropore is 0.1 μm-50 μm.

Alternatively or additionally, in the display panel provided by an embodiment of the disclosure, the polymer is polyvinylidene fluoride, polyurethane or polytetrafluoroethylene.

Alternatively or additionally, in the display panel provided by an embodiment of the disclosure, the inner wall of the through-hole is further arranged with a layer of encapsulation film.

Alternatively or additionally, in the display panel provided by an embodiment of the disclosure, the orthographic projection area of the through-hole on the substrate is less than ⅕ of the orthographic projection area of the pixel unit on the substrate. Alternatively or additionally, in the display panel provided by an embodiment of the disclosure, there are a plurality of through-holes arranged within the area where one said pixel unit is located, and the plurality of said through-holes are uniformly arranged within the area where the pixel unit is located.

Alternatively or additionally, in the display panel provided by an embodiment of the disclosure, there are a plurality of through-holes arranged within the display area, and the plurality of said through-holes are uniformly arranged within the display area.

Alternatively or additionally, in the display panel provided by an embodiment of the disclosure, the polyvinylidene fluoride is produced by the electrospinning technology in a mixed solution in which the volume ratio of dimethylformamide to acetone is 6:4, such that the mass concentration of the resultant polyvinylidene fluoride is 12%.

Correspondingly, an embodiment of the disclosure further provides a wearable device comprising a display assembly, wherein the display assembly employs any of the above-described display panels provided by embodiments of the disclosure.

Correspondingly, an embodiment of the disclosure further provides a method for preparing a display panel as described above, which comprises the following steps of: preparing and forming a display panel body, forming through-holes running through the display panel body, and filling a hydrophobic gas-permeable material into the individual through-holes and curing it.

Correspondingly, the formed through-holes have the features in the above preferred instances.

DETAILED DESCRIPTION

Figure 1:
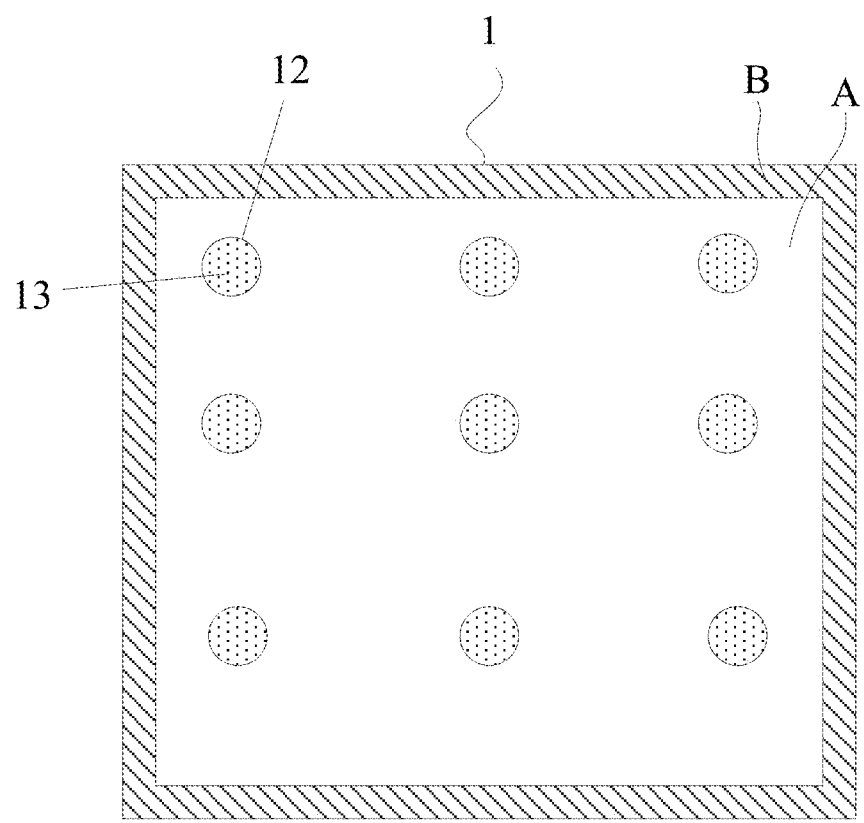
FIG. 1 is a first structural diagram of a display panel provided by an embodiment of the disclosure.

In the following specific implementations of a display panel, a method for preparing the same and a wearable device provided by embodiments of the disclosure will be described in detail in conjunction with the drawings.

The shape and size of an individual component in the drawings do not reflect the true scale of the display panel, the goal of which is only to schematically illustrate the content of the disclosure.

As shown in FIG. 1, a display panel provided by an embodiment of the disclosure comprises a display panel body 1, wherein the display panel body 1 has at least one through-hole 12, and the through-hole 12 is filled with a hydrophobic gas-permeable material 13. Alternatively or additionally, in the display panel provided by an embodiment of the disclosure, as shown in FIG. 1, the display panel body 1 has a display area A and a peripheral area B surrounding the display area A, and the through-hole 12 is located in the display area. Of course, when implemented specifically, the through-hole 12 may also be located in the peripheral area B, which will not be defined herein.

Figure 2:
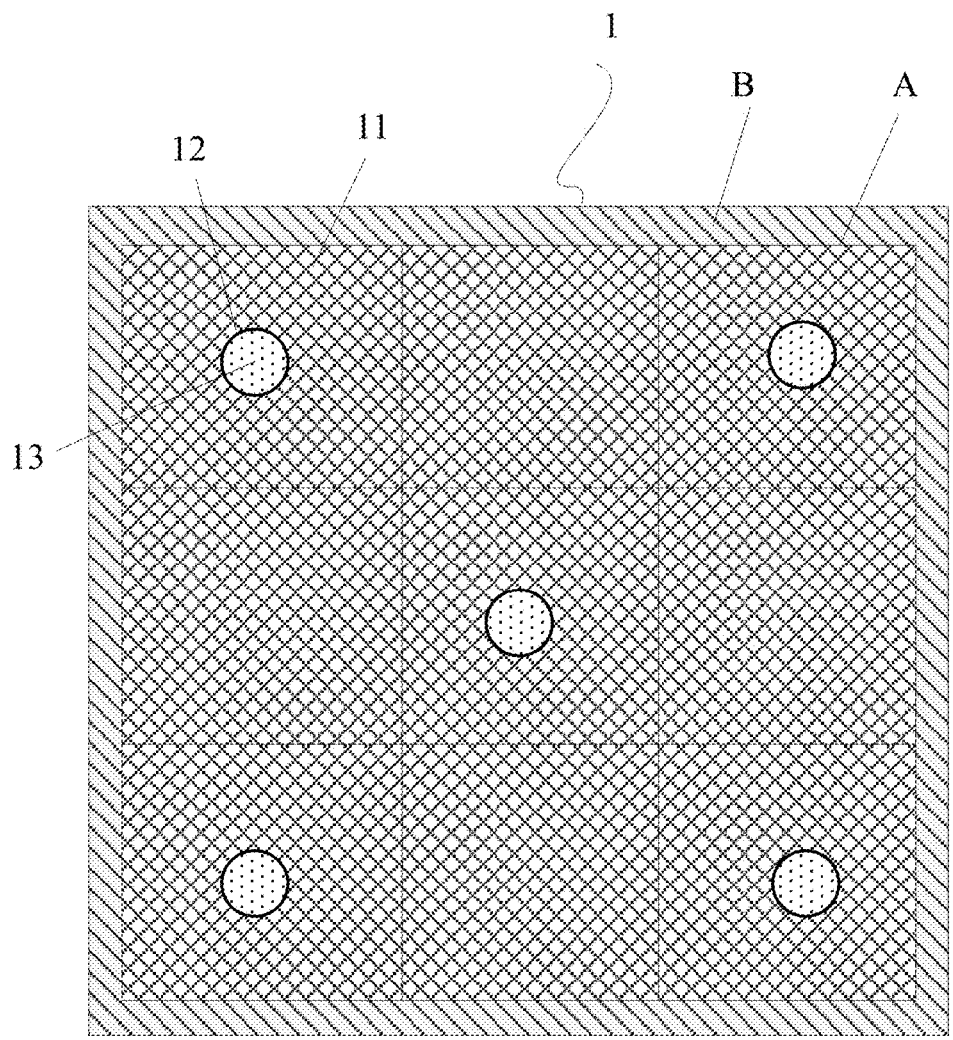
FIG. 2 is a second structural diagram of a display panel provided by an embodiment of the disclosure.

Alternatively or additionally, in the display panel provided by an embodiment of the disclosure, as shown in FIG. 2, the display area A of the display panel body 1 has a substrate 10 (not shown in FIG. 1) and a pixel unit 11 located on the substrate 10, the through-hole 12 is located within an area where the pixel unit 11 is located, and the through-hole 12 runs through the substrate 10 and the pixel unit 11.

When implemented specifically, in the display panel provided by an embodiment of the disclosure, in the display area, in addition to the pixel unit that is arranged therein, is also arranged a shading area of signal lines such as a gate line, a data line, etc. and an electronic device such as a thin film transistor TFT, etc. Of course, the through-hole may also be arranged in the shading area, however, the arrangement of the through-hole in the shading area might affect these signal lines or the electronic device, and thereby will affect display.

Alternatively or additionally, in the display panel provided by an embodiment of the disclosure, the hydrophobic gas-permeable material is a polymer with multiple micropores, and thus only air or water vapor may penetrate the through-hole, whereas liquid cannot penetrate.

Alternatively or additionally, in the display panel provided by an embodiment of the disclosure, the pore size of the micropore is 0.1 μm-50 μm.

When implemented specifically, in the display panel provided by an embodiment of the disclosure, the polymer may be a natural polymer, and alternatively also may be a synthetic polymer, which will not be defined.

Alternatively or additionally, in the display panel provided by an embodiment of the disclosure, the polymer is polyvinylidene fluoride, polyurethane or polytetrafluoroethylene, etc.

Alternatively or additionally, in the display panel provided by an embodiment of the disclosure, the polyvinylidene fluoride is produced by the electrospinning technology in a mixed solution in which the volume ratio of dimethylformamide to acetone is 6:4, such that the mass concentration of the resultant polyvinylidene fluoride is 12%. The gas permeability of the polyvinylidene fluoride is good and its waterproof performance is good.

When implemented specifically, the display panel provided by an embodiment of the disclosure may be a liquid crystal display panel, and of course, may also be an organic electroluminescent display panel, which will not be defined herein.

Figure 3A:
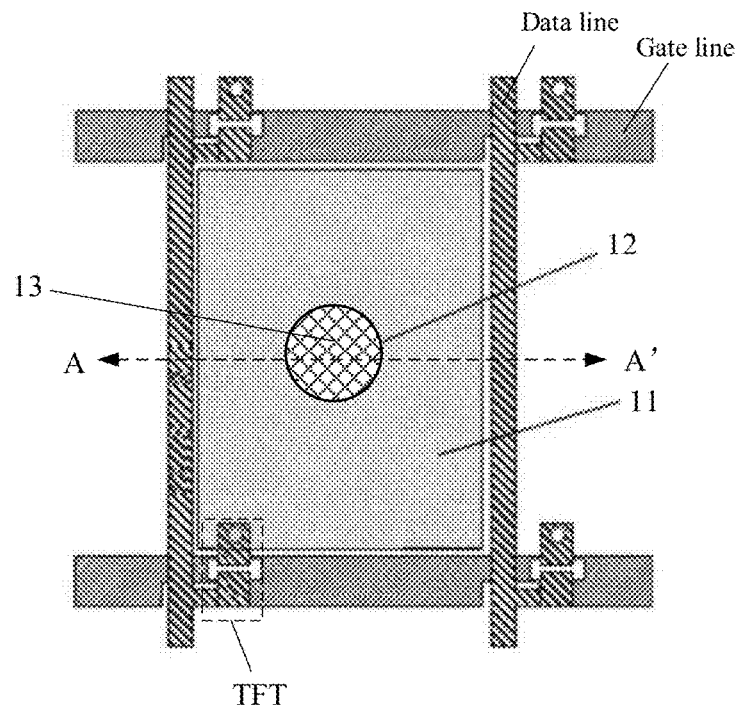
FIG. 3a is a schematic top view of a pixel unit provided by an embodiment of the disclosure.
Figure 3B:
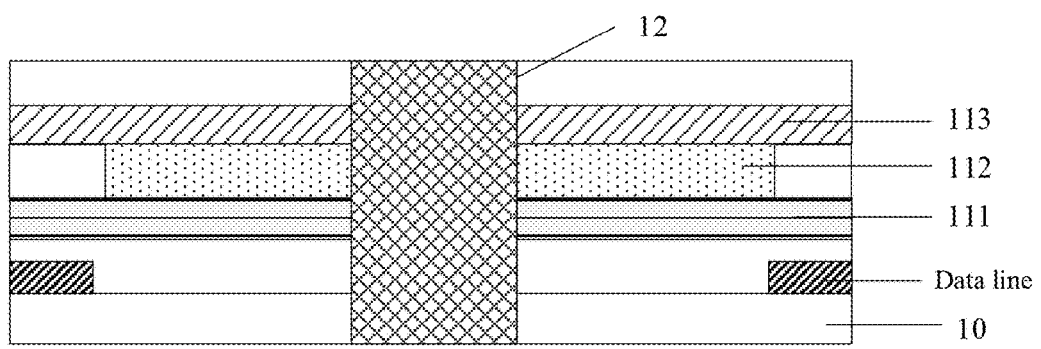
FIG. 3b is a cross-sectional schematic diagram of FIG. 3a along the A-A' direction.

When implemented specifically, when the display panel provided by embodiments of the disclosure is an organic electroluminescent display panel, as shown in FIG. 3a and FIG. 3b, in the pixel unit 11 are generally arranged an anode layer 111, a light emitting layer 112 and a cathode layer 113, whereas around the pixel unit 11 are generally at least arranged signal lines such as a gate line, a data line, etc. and an electronic device such as a TFT.

Therefore, to avoid that the through-hole affects the signal lines and the TFT and thereby affects display, alternatively or additionally, in the display panel provided by an embodiment of the disclosure, as shown in FIG. 3a and FIG. 3b, the through-hole is arranged in the center area of the area where the pixel unit 11 is located, wherein FIG. 3b is a cross-sectional schematic diagram of FIG. 3a along the A-A' direction.

Figure 4:
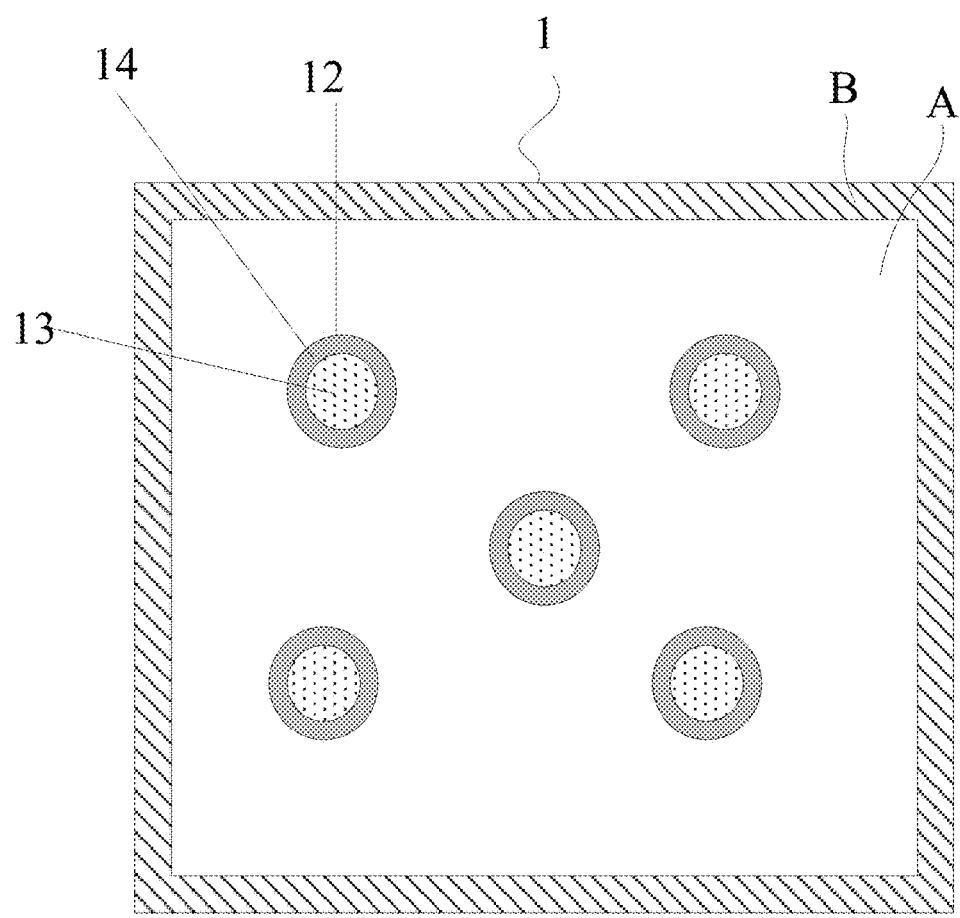
FIG. 4 is a third structural diagram of a display panel provided by an embodiment of the disclosure.

Alternatively or additionally, in the display panel provided by an embodiment of the disclosure, as shown in FIG. 4, the inner wall of the through-hole 12 is further arranged with a layer 14 of encapsulation film, to avoid that water vapor enters inside the display panel body 1 and thereby affect the lifetime of the display panel.

When implemented specifically, in the display panel provided by an embodiment of the disclosure, depending on the actual situation, the area where the through-hole is located may be determined according to the needs for the display and ventilation functions. Alternatively or additionally, in order not to seriously affect the display effect, the orthographic projection area of the through-hole on the substrate is less than ⅕ of the orthographic projection area of the pixel unit on the substrate.

When implemented specifically, in the display panel provided by an embodiment of the disclosure, within the area where one pixel unit is located may be arranged one through-hole, and alternatively also may be arranged a plurality of through-holes, which will not be defined herein.

Alternatively or additionally, when there are a plurality of through-holes arranged within the area where one pixel unit is located, and the plurality of through-holes are uniformly arranged within the area where the pixel unit is located.

When implemented specifically, in the display panel provided by an embodiment of the disclosure, there are a plurality of through-holes arranged within the display area, and the plurality of through-holes are uniformly arranged within the display area. As such, the display panel may be made to have better gas permeability.

Alternatively or additionally, in the display panel provided by an embodiment of the disclosure, the substrate is a flexible substrate. As such, the display panel may be made to be a flexible display panel, thereby may be bent into a corresponding shape and hence is more suitable for a wearable device.

Alternatively or additionally, in the display panel provided by an embodiment of the disclosure, the material of the flexible substrate is polyimide.

Figure 5:
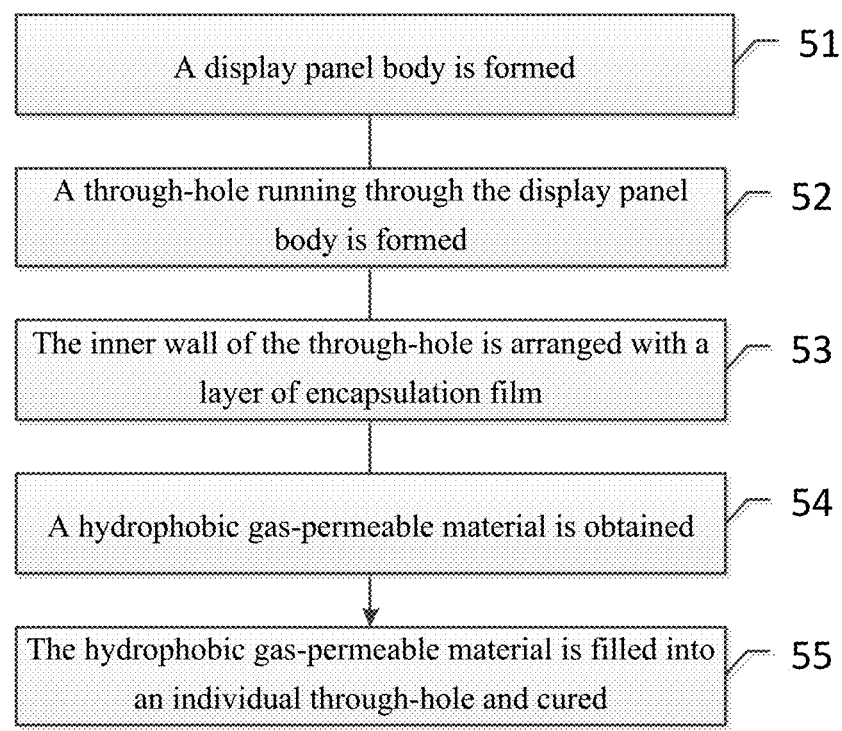
FIG. 5 is a flow chart of preparing a display panel provided by an embodiment of the disclosure.

FIG. 5 is a flow chart of preparing a display panel provided by an embodiment of the disclosure.

At step 51, a display panel body is first prepared and formed. When implemented specifically, the display panel body prepared by an embodiment of the disclosure may be one of a liquid crystal display panel, and of course, may also be one of an organic electroluminescent display panel, which will not be defined herein. With the organic electroluminescent display panel as an example and without limitation, a thin film transistor, an insulation layer, an anode layer, a light emitting layer, a cathode layer and a protection layer are successively prepared on a flexible substrate by the photolithography method, thereby forming the display panel body.

Afterwards, at step 52, a through-hole running through the display panel body is formed. As an example and without limitation, a through-hole running through the display panel body is formed by the dry etching, the wet etching, the laser, the penetration and other processes. When implemented specifically, in the method for preparing a display panel provided by an embodiment of the disclosure, depending on the actual situation, the area where the through-hole is located may be determined according to the needs for the display and ventilation functions. Alternatively or additionally, in order not to seriously affect the display effect, the orthographic projection area of the through-hole on the substrate is made to be less than ⅕ of the orthographic projection area of the pixel unit on the substrate. When implemented specifically, in the method for preparing a display panel provided by an embodiment of the disclosure, within the area where one pixel unit is located may be arranged one through-hole, and alternatively also may be arranged a plurality of through-holes, which will not be defined herein. Alternatively or additionally, when there are a plurality of through-holes arranged within the area where one pixel unit is located, and the plurality of through-holes are uniformly arranged within the area where the pixel unit is located. When implemented specifically, in the method for preparing a display panel provided by an embodiment of the disclosure, a plurality of through-holes are arranged within a display area, and the plurality of through-holes are uniformly arranged within the display area. As such, the display panel may be made to have better gas permeability. The display panel body has the display area and a peripheral area surrounding the display area, and the through-hole may be formed in the display area, and alternatively also may be formed in the peripheral area, which will not be defined herein. In an implementation of the disclosure, the display area comprises a substrate and a pixel unit located on the substrate. Alternatively or additionally, the through-hole is formed within the area where the pixel unit is located and runs through the substrate and the pixel unit.

When preparing the display panel provided by embodiments of the disclosure, it may be possible to form the pixel unit on the substrate, then form the through-hole running through the substrate and the pixel unit, and finally fill the hydrophobic gas-permeable material in the through-hole. Of course, when implemented, it may also be possible that after one or more film layer (e.g., an insulation layer, an anode layer, a light emitting layer, etc.) is formed, the through-hole is formed at a position in these film layers corresponding to the through-hole, and after the through-hole in the last film layer is formed, the whole through-hole is accomplished, and then the hydrophobic gas-permeable material is filled in the through-hole.

Optionally, at step 53, the inner wall of the through-hole is arranged with a layer of encapsulation film, to avoid that water vapor enters inside the display panel body and thereby affect the lifetime of the display panel.

At step 54, a hydrophobic gas-permeable material is obtained to be filled into an individual through-hole. Optionally, the material may also be acquired by preparation, and alternatively may be acquired in other ways, which will not be defined herein. Alternatively or additionally, in the method for preparing a display panel provided by an embodiment of the disclosure, the employed hydrophobic gas-permeable material is a polymer with multiple micropores, and thus only air or water vapor may penetrate the through-hole, whereas liquid cannot penetrate. Alternatively or additionally, in the method for preparing a display panel provided by an embodiment of the disclosure, the pore size of the micropore is 0.1 μm-50 μm. When implemented specifically, in the method for preparing a display panel provided by an embodiment of the disclosure, the employed polymer may be a natural polymer, and alternatively also may be a synthetic polymer, which will not be defined. Alternatively or additionally, in the display panel provided by an embodiment of the disclosure, the employed polymer is polyvinylidene fluoride, polyurethane or polytetrafluoroethylene, etc. When implemented specifically, when the hydrophobic gas-permeable material is polyvinylidene fluoride, the polyvinylidene fluoride may be produced by the electrospinning technology in a mixed solution of dimethylformamide and acetone. Further, when the volume ratio of the mixed solution of dimethylformamide and acetone is 6:4, the polyvinylidene fluoride with the mass concentration of 12% may be produced, and the gas permeability of the polyvinylidene fluoride is good and its waterproof performance is good.

At step 55, the hydrophobic gas-permeable material is filled into an individual through-hole and cured. As an example and without limitation, the hydrophobic gas-permeable material is filled into an individual through-hole by the coating process. Based on one and the same concept, an embodiment of the disclosure further provides a wearable device comprising a display assembly, wherein the display assembly employs the above-described display panel provided by embodiments of the disclosure. Since the principles with which the wearable device solves the problem are similar to those of one of the previously mentioned display panels, the implementation of the wearable device may refer to that of the previously mentioned display panel, and the repetition points will not be repeated any more.

Clearly, various changes and variations to the disclosure may be made by the skilled in the art without departing from the spirit and scope of the disclosure. Thus, if these modifications and variations to the disclosure pertain to the scope of the claims and their equivalents of the disclosure, the disclosure is also intended to encompass these changes and variations.

The invention claimed is:

1. A display panel comprising a display panel body, wherein the display panel body has at least one through-hole, and the through-hole is filled with a hydrophobic gas-permeable material.

2. The display panel as claimed in claim 1, wherein the display panel body has a display area and a peripheral area surrounding the display area, and
the through-hole is located in the display area.

3. The display panel as claimed in claim 2, wherein the display area of the display panel body has a substrate and a pixel unit located on the substrate, the through-hole is located within an area where the pixel unit is located, and the through-hole runs through the substrate and the pixel unit.

4. The display panel as claimed in claim 3, wherein the orthographic projection area of the through-hole on the substrate is less than ⅕ of the orthographic projection area of the pixel unit on the substrate.

5. The display panel as claimed in claim 3, wherein there are a plurality of through-holes arranged within the area where one said pixel unit is located, and the plurality of said through-holes are uniformly arranged within the area where the pixel unit is located.

6. The display panel as claimed in claim 2, wherein there are a plurality of through-holes arranged within the display area, and the plurality of said through-holes are uniformly arranged within the display area.

7. The display panel as claimed in claim 1, wherein the hydrophobic gas-permeable material is a polymer with multiple micropores.

8. The display panel as claimed in claim 7, wherein the pore size of the micropore is 0.1 μm-50 μm.

9. The display panel as claimed in claim 7, wherein the polymer is polyvinylidene fluoride, polyurethane or polytetrafluoroethylene.

10. The display panel as claimed in claim 9, wherein the polyvinylidene fluoride is produced by the electrospinning technology in a mixed solution in which the volume ratio of dimethylformamide to acetone is 6:4, such that the mass concentration of the produced polyvinylidene fluoride is 12%.

11. The display panel as claimed in claim 1, wherein the inner wall of the through-hole is further arranged with a layer of encapsulation film.

12. A wearable device comprising a display assembly, wherein the display assembly employs a display panel as claimed in any of claim 1.

13. A method for preparing a display panel, comprising the following steps of:
   preparing and forming a display panel body,
   forming through-holes running through the display panel body, and
   filling a hydrophobic gas-permeable material into the individual through-holes and curing it.

14. The method for preparing a display panel as claimed in claim 13, wherein the display panel body has a display area and a peripheral area surrounding the display area, and the through-hole is formed in the display area.

15. The method for preparing a display panel as claimed in claim 14, wherein the preparing and forming a display panel body further comprises:
   the display area of the display panel body comprising a substrate and a pixel unit located on the substrate, forming the through-hole within an area where the pixel unit is located, which runs through the substrate and the pixel unit.

16. The method for preparing a display panel as claimed in claim 15, wherein the orthographic projection area of the through-hole on the substrate is less than ⅕ of the orthographic projection area of the pixel unit on the substrate.

17. The method for preparing a display panel as claimed in claim 15, wherein there are a plurality of through-holes arranged within the area where one said pixel unit is located, and the plurality of said through-holes are uniformly arranged within the area where the pixel unit is located.

18. The method for preparing a display panel as claimed in claim 13, wherein a polymer with multiple micropores is used as the hydrophobic gas-permeable material.

19. The method for preparing a display panel as claimed in claim 18, wherein the pore size of the micropore of the polymer is 0.1 μm-50 μm.

20. The method for preparing a display panel as claimed in claim 13, further comprising: arranging a layer of encapsulation film on the inner wall of the through-hole.

* * * * *